US006725247B2

(12) United States Patent
Acharya

(10) Patent No.: US 6,725,247 B2
(45) Date of Patent: Apr. 20, 2004

(54) TWO-DIMENSIONAL PYRAMID FILTER ARCHITECTURE

(75) Inventor: Tinku Acharya, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 444 days.

(21) Appl. No.: 09/846,609

(22) Filed: Apr. 30, 2001

(65) Prior Publication Data

US 2002/0194234 A1 Dec. 19, 2002

(51) Int. Cl.[7] .............................. G06F 17/10; G06K 9/40
(52) U.S. Cl. ...................... 708/308; 382/240; 382/260
(58) Field of Search ................................ 708/300, 301, 708/308, 313, 319; 382/240, 260

(56) References Cited

U.S. PATENT DOCUMENTS 5,359,674 A    10/1994   van der Wal
5,963,675 A  * 10/1999   van der Wal et al. ........ 382/260
6,018,597 A  *  1/2000   Maltsev et al. ............. 382/260

OTHER PUBLICATIONS

1998 IEEE; "Simplified Design of Steerable Pyramid Filters", K. Castleman, et al., pp.: V–329–V–332.
1997 IEEE, "A High–Speed Reconfigurable Integrated Architecture for DWT", T. Acharya, p. 669–673.

* cited by examiner

Primary Examiner—Chuong Dinh Ngo
(74) Attorney, Agent, or Firm—Sharon Wong

(57) ABSTRACT

An integrated circuit has a two-dimensional pyramid filter architecture of an order 2N−1, where N is a positive integer greater than five. The two dimensional pyramid filter, in operation, capable of producing, on respective clock cycles, pyramid filtered output signals corresponding to output signals produced by fourteen one-dimensional pyramid filters of order 2N−1, and pyramid filtered output signals corresponding to output signals produced either by four two-dimensional pyramid filters or one two-dimensional pyramid filter of order [2(N−1)−1] using signal sample matrices of order [2(N−1)−1]. The respective output signals in said two-dimensional pyramid filter architecture are summed on respective clock cycles of said two dimensional pyramid filter architecture.

23 Claims, 9 Drawing Sheets

$$P^{kxk} = \begin{bmatrix} P^{kxk}_{0,0} & P^{kxk}_{0,1} & \cdots & & & P^{kxk}_{0,N-1} \\ P^{kxk}_{1,0} & P^{kxk}_{1,1} & & & & P^{kxk}_{1,N-1} \\ \vdots & \vdots & & & & \vdots \\ & & & P^{kxk}_{i,j} & & \\ \vdots & \vdots & & & & \vdots \\ P^{kxk}_{M-1,0} & P^{kxk}_{M-1,1} & \cdots & & & P^{kxk}_{M-1,N-1} \end{bmatrix}$$

FIG. 4

$$S = \begin{bmatrix} S_{0,0} & S_{0,1} & \cdots & S_{i-1,j-1} & S_{i-1,j} & S_{i-1,j+1} & \cdots & S_{0,N-1} \\ S_{1,0} & & & S_{i,j-1} & S_{i,j} & S_{i,j+1} & & S_{1,N-1} \\ \vdots & & & S_{i+1,j-1} & S_{i+1,j} & S_{i+1,j+1} & & \vdots \\ S_{M-1,0} & S_{M-1,1} & & & & & & S_{M-1,N-1} \end{bmatrix}$$

FIG. 5

$$F_{k \times k} = \begin{bmatrix} 1 \\ 2 \\ 3 \\ \vdots \\ \frac{k+1}{2} \\ \vdots \\ 3 \\ 2 \\ 1 \end{bmatrix} * \begin{bmatrix} 1 & 2 & 3 & \cdots & \frac{k+1}{2} & \cdots & 4 & 3 & 2 & 1 \end{bmatrix}$$

$$= \begin{bmatrix} 1 & 2 & 3 & \cdots & \frac{k+1}{2} & \cdots & 3 & 2 & 1 \\ 2 & 4 & 6 & \cdots & \frac{2(k+1)}{2} & \cdots & 6 & 4 & 2 \\ 3 & 6 & 9 & \cdots & \frac{3(k+1)}{2} & \cdots & 9 & 6 & 3 \\ \vdots & \vdots & \vdots & \vdots & \vdots & & \vdots & \vdots & \vdots \\ \frac{k+1}{2} & \frac{2(k+1)}{2} & \frac{3(k+1)}{2} & \cdots & \frac{(k+1)*(k+1)}{4} & \cdots & \frac{3(k+1)}{2} & \frac{2(k+1)}{2} & \frac{k+1}{2} \\ \vdots & \vdots & \vdots & \vdots & \vdots & & \vdots & \vdots & \vdots \\ 3 & 6 & 9 & \cdots & \frac{3(k+1)}{2} & \cdots & 9 & 6 & 3 \\ 2 & 4 & 6 & \cdots & \frac{2(k+1)}{2} & \cdots & 6 & 4 & 2 \\ 1 & 2 & 3 & \cdots & \frac{k+1}{2} & \cdots & 3 & 2 & 1 \end{bmatrix}$$

FIG. 6

$$F_{11 \times 11} = \begin{bmatrix} 1 \\ 2 \\ 3 \\ 4 \\ 5 \\ 6 \\ 5 \\ 4 \\ 3 \\ 2 \\ 1 \end{bmatrix} * [1\ 2\ 3\ 4\ 5\ 6\ 5\ 4\ 3\ 2\ 1] = \begin{bmatrix} 1 & 2 & 3 & 4 & 5 & 6 & 5 & 4 & 3 & 2 & 1 \\ 2 & 4 & 6 & 8 & 10 & 12 & 10 & 8 & 6 & 4 & 2 \\ 3 & 6 & 9 & 12 & 15 & 18 & 15 & 12 & 9 & 6 & 3 \\ 4 & 8 & 12 & 16 & 20 & 24 & 20 & 16 & 12 & 8 & 4 \\ 5 & 10 & 15 & 20 & 25 & 30 & 25 & 20 & 15 & 10 & 5 \\ 6 & 12 & 18 & 24 & 30 & 36 & 30 & 24 & 18 & 12 & 6 \\ 5 & 10 & 15 & 20 & 25 & 30 & 25 & 20 & 15 & 10 & 5 \\ 4 & 8 & 12 & 16 & 20 & 24 & 20 & 16 & 12 & 8 & 4 \\ 3 & 6 & 9 & 12 & 15 & 18 & 15 & 12 & 9 & 6 & 3 \\ 2 & 4 & 6 & 8 & 10 & 12 & 10 & 8 & 6 & 4 & 2 \\ 1 & 2 & 3 & 4 & 5 & 6 & 5 & 4 & 3 & 2 & 1 \end{bmatrix}$$

FIG. 7

$$P^{1 \times k} = \begin{bmatrix} P_{0,0}^{1 \times k} & P_{0,1}^{1 \times k} & \cdots & & & & P_{0,N-1}^{1 \times k} \\ P_{1,0}^{1 \times k} & P_{1,1}^{1 \times k} & & & & & P_{1,N-1}^{1 \times k} \\ \vdots & & & & & & \vdots \\ & & & P_{i,j}^{1 \times k} & & & \\ \vdots & & & & & & \vdots \\ P_{M-1,0}^{1 \times k} & P_{M-1,1}^{1 \times k} & \cdots & & & & P_{M-1,N-1}^{1 \times k} \end{bmatrix}$$

FIG. 8

$$P^{kx1} = \begin{bmatrix} P_{0,0}^{kx1} & P_{0,1}^{kx1} & \cdots & P_{0,N-1}^{kx1} \\ P_{1,0}^{kx1} & P_{1,1}^{kx1} & \cdots & P_{1,N-1}^{kx1} \\ \vdots & \vdots & P_{i,j}^{kx1} & \vdots \\ P_{M-1,0}^{kx1} & P_{M-1,1}^{kx1} & \cdots & P_{M-1,N-1}^{kx1} \end{bmatrix}$$

FIG. 9

TWO-DIMENSIONAL PYRAMID FILTER ARCHITECTURE

RELATED APPLICATIONS

This patent application is related to U.S. patent application Ser. No. 09/754,684, titled "Multiplierless Pyramid Filter," filed Jan. 3, 2001, by Tinku Acharya; U.S. patent application Ser. No. 09/817,711, titled "Two-Dimensional Pyramid Filter Architecture," (attorney docket 042390.P11275), filed Mar. 26, 2001, by Tinku Acharya; U.S. patent application Ser. No. 09/820,108, titled "Pyramid Filter," (attorney docket 042390.P11211), filed Mar. 28, 2001, by Tinku Acharya; U.S. patent application Ser. No. 09/823,212, titled "Two-Dimensional Pyramid Filter Architecture," (attorney docket 042390.P1 1276), filed Mar. 30, 2001, by Tinku Acharya, and U.S. patent application Ser. No. 09/823,390, titled "Two-Dimensional Pyramid Filter Architecture," (attorney docket 042390.P11277), filed Mar. 30, 2001, by Tinku Acharya, all assigned to the assignee of the presently claimed subject matter and herein incorporated by reference.

BACKGROUND

This disclosure is related to pyramid filters.

In image processing, it is often desirable to decompose an image, such as a scanned color image, into two or more separate image representations. For example, a color or gray-scale document image can be decomposed into background and foreground images for efficient image processing operations, such as enhancement, compression, etc., as are at times applied in a typical photocopying machine or scanner device. In this context, this operation is often referred to as a descreening operation. This descreening is also sometimes applied to remove halftone patterns that may exist in an original scanned image. For example, these halftone patterns may cause objectionable artifacts for human eyes if not properly removed. The traditional approach for this decomposition or descreening is to filter the color image in order to blur it. These blurred results are then used to assist in determining how much to blur and sharpen the image in order to produce the decomposition. Typically this blurring can be achieved using a "symmetric pyramid" filter. Symmetric pyramid finite impulse response (FIR) filters are well-known.

One disadvantage of this image processing technique, however, is that the complexity increases many fold when a number of pyramid filters of different sizes is applied in parallel in order to generate multiple blurred images, to apply the technique as just described. A brute force approach for this multiple pyramid filtering approach is to use multiple FIR filters in parallel, as illustrated in FIG. 1. Such an approach demonstrates that the design and implementation of fast "symmetric pyramid filtering" architectures to generate different blurred images in parallel from a single source image may be desirable.

The numbers provided in parenthesis for each FIR block in FIG. 1 represents the pyramid filter of corresponding length. For example, (1, 2, 1) are the filter coefficients for a symmetric pyramid finite impulse response (FIR) filter of order or length 3. Likewise, (1, 2, 3, 2, 1) are the coefficients for an FIR pyramid filter of order 5, (1, 2, 3, 4, 3, 2, 1) are the coefficients for an FIR pyramid filter of order 7, (1, 2, 3, 4, 5, 4, 3, 2, 1) are the coefficients for an FIR pyramid filter of order 9, (1, 2, 3, 4, 5, 6, 5, 4, 3, 2, 1) are the coefficients for an FIR pyramid filter of order 11, and so forth.

Unfortunately, the approach demonstrated in FIG. 1 has disadvantages. For example, inefficiency may result from redundant computations. Likewise, FIR implementations frequently employ multiplier circuits. While implementations exist to reduce or avoid the use of multipliers, such as with shifting and summing circuitry, that may then result in increased clocking and, hence, may reduce circuit throughput. A need, therefore, exists for improving pyramid filtering implementations or architectures.

BRIEF DESCRIPTION OF THE DRAWINGS

Subject matter is particularly pointed out and distinctly claimed in the concluding portion of the specification. The claimed subject matter, however, both as to organization and method of operation, together with objects, features, and appendages thereof, may best be understood by reference of the following detailed description when read with the accompanying drawings in which:

FIG. 4 is a table/matrix showing an example of a matrix that may result from implementing a two-dimensional pyramid filter architecture, such as one that may be implemented by the embodiment of FIG. 3;

FIG. 5 is a table/matrix showing an example of a two-dimensional signal that may be operated upon by a two-dimensional pyramid filter architecture;

FIG. 6 is a table/matrix showing an example of applying a one-dimensional pyramid filter kernel both row-wise and column-wise;

FIG. 7 is the table/matrix of FIG. 6 for k=11;

FIG. 8 is a table/matrix showing the result of applying a one-dimensional pyramid filter to the rows of a two-dimensional input signal sample matrix; and FIG. 9 is a table/matrix showing the result of applying a one-dimensional pyramid filter to the columns of a two-dimensional input signal sample matrix.

DETAILED DESCRIPTION

In the following detailed description, numerous specific details are set forth in order to provide a thorough understanding of the claimed subject matter. However, it will be understood by those skilled in the art that the claimed subject matter may be practiced without these specific details. In other instances, well-known methods, procedures, components and circuits have not been described in detail in order so as not to obscure the claimed subject matter.

As previously described, pyramid filtering, in particular, symmetric pyramid filtering, may be employed in connection with color images or color image processing in order to decompose or descreen the image, such as into a background and foreground image, for example. Although the claimed subject matter is not limited in scope in this respect, in such a context, pyramid filtering architectures that reduce computational complexity or processing and/or hardware cost are particularly desirable. Likewise, implementations that are multiplerless, that is, do not specifically employ multiplication in the implementation, are also desirable usually because such implementations or embodiments are cheaper to implement than those that employ or include multiplier circuits.

Figure 1:
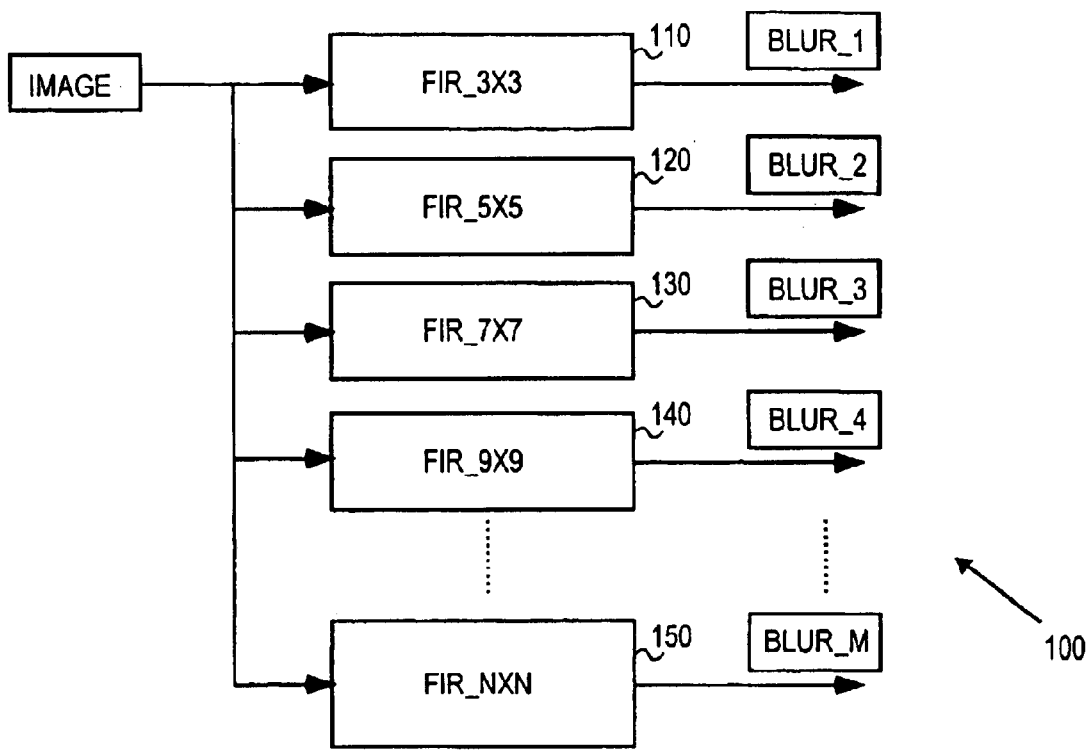
FIG. 1 is a block diagram illustrating a brute force approach to implementing a finite impulse response (FIR) multiple pyramid filtering architecture.
Figure 2:
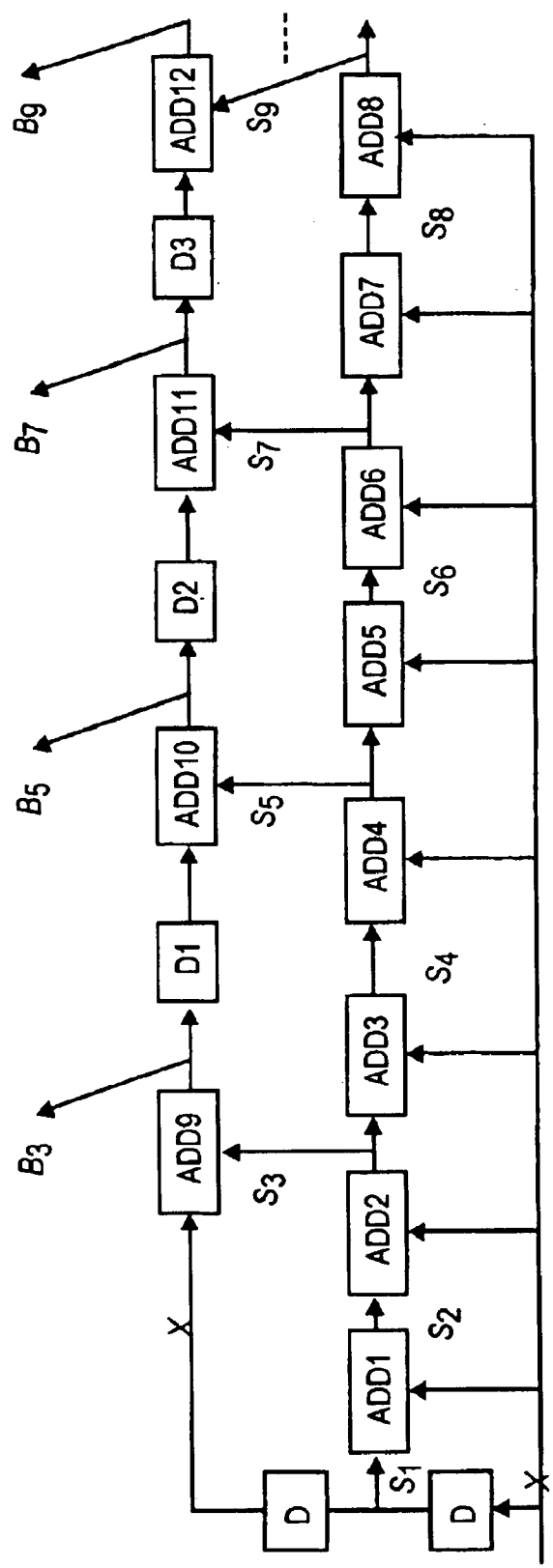
FIG. 2 is one embodiment of a one-dimensional multiplierless pyramid filter.

Although the claimed subject matter is not limited in scope in this respect, FIG. 2 illustrates an embodiment 200 of a one-dimensional pyramid filter, such as described in more detail in aforementioned U.S. patent application Ser. No. 09/754,684, titled "Multiplierless Pyramid Filter," by T. Acharya (attorney docket no. 042390.P10722), filed on Jan. 3, 2001. Embodiment 200 comprises a unified multiplierless cascaded symmetric pyramid filtering architecture to generate a multiple number of filtered output signal streams for a series or sequence of pyramid filters having different orders, the generation of the output signal streams occurring in parallel. In this particular embodiment, although, again, the claimed subject matter is not limited in scope in this respect, a filtered output signal stream is produced on every clock cycle for each pyramid filter of a different order being implemented. Therefore, in addition to being computationally efficient, this particular embodiment produces good results in terms of throughput. However, as previously indicated, this particular embodiment implements a one-dimensional pyramid filter.

FIG. 2 is understood in the context of specific notation. For example, an input source signal, X, may be designated as follows:

$$X=(X_0, X_1, \ldots, X_{i-2}, X_{i-1}, X_i, X_{i+1}, X_{i+2}, \ldots)$$

In digital or discrete signal processing, filtering may be expressed as a convolution, $\hat{\times}$, of the input signal, X, and a filter, F, in this context a digital filter of finite length, referred to here as a finite impulse response (FIR) filter. Therefore, the filtered output signal stream is indicated as follows:

$$Y = X \hat{\times} F$$

As previously described, the particular embodiment in FIG. 2 employs pyramid filters. These filters are typically implemented using digital filters of lengths or orders that are odd, such as 3, 5, 7, 9, etc. Odd numbers or orders, in this context, may be expressed in the form 2N−1, where N is a positive integer greater than two, for example. Some examples of such digital filters are as follows:

$F_3=(1, 2, 1)$
$F_5=(1, 2, 3, 2, 1)$
$F_7=(1, 2, 3, 4, 3, 2, 1)$
$F_9=(1, 2, 3, 4, 5, 4, 3, 2, 1)$
$F_{11}=(1, 2, 3, 4, 5, 6, 5, 4, 3, 2, 1)$
$F_M=(1, 2, 3, \ldots, N, \ldots, 3, 2, 1)$ (where, in this context, M=2N−1)

For the foregoing filters, the filtered output signals or output signal streams may be represented as follows:

$B^3 = X \hat{\times} F_3 = (b_0^3, b_1^3, \ldots, b_{i-1}^3, b_i^3, b_{i+1}^3, \ldots)$ result of input signal X filtered by $F_3$ $B^5 = X \hat{\times} F_5 = (b_0^5, b_1^5, \ldots, b_{i-1}^5, b_i^5, b_{i+1}^5, \ldots)$ result of input signal X filtered by $F_5$ $B^7 = X \hat{\times} F_7 = (b_0^7, b_1^7, \ldots, b_{i-1}^7, b_i^7, b_{i+1}^7, \ldots)$ result of input signal X filtered by $F_7$ $B^9 = X \hat{\times} F_9 = (b_0^9, b_1^9, \ldots, b_{i-1}^9, b_i^9, b_{i+1}^9, \ldots)$ result of input signal X filtered by $F_9$ $B^{11} = X \hat{\times} F_{11} = (b_0^{11}, b_1^{11}, \ldots, b_{i-1}^{11}, b_i^{11}, b_{i+1}^{11}, \ldots)$ result of input signal X filtered by $F_{11}$

. . .

$B^M = X \hat{\times} F_M = (b_0^M, b_1^M, \ldots, b_{i-1}^M, b_i^M, b_{i+1}^M, \ldots)$ result of input signal X filtered by $F_M$ An alternate way to empirically represent these filtered output signal samples is as follows:

$b_i^3 = x_{i-1} + 2x_i + x_{i+1}$ $b_i^5 = x_{i-2} + 2x_{i-1} + 3x_i + 2x_{i+1} + x_{i+2}$ $b_i^7 = x_{i-3} + 2x_{i-2} + 3x_{i+1} + 4x_i + 3x_{i+1} + 2x_{i+2}x + {i+3}$ $b_i^9 = x_{i-4} + 2x_{i-3} + 3x_{i-2} + 4x_{i-1} + 5x_i + 4x_{i+1} 3x_{i+2} 2x_{i+3} + x_4$ $b_i^{11} = x_{i-5} + 2x_{i-4} + 3x_{i-3} + 4x_{i-2} + 5x_{i-1} + 6x_i + 5x_{i+1} + 4x_{i+2} + 3x_{i+3} + 2x_{i+4} x_{i+5}$

Likewise, by introducing what is referred to, in this context, as state variables, the above expressions may be re-expressed as follows:

$b_i^3 = x_i + s_i^3$ where $s_i^3 = x_{i-1} + x_i + x_{i+1}$ $b_i^5 = b_i^3 + s_i^5$ where $s_i^5 = x_{i-2} + x_{i-1} + x_i + x_{i+1} + x_{i+2}$ $b_i^7 = b_i^5 + s_i^7$ where $s_i^7 = x_{i-3} + x_{i-2} + x_{i-1} + x_i + x_{i+1} + x_{i+2} + x_{i+3} + x_{i-4}$ $b_i^9 = b_i^7 + s_i^9$ where $s_i^9 = x_{i-4} + x_{i-3} + x_{i-2} + x_{i-1} + x_i + x_{i+1} + x_{i+2} + x_{i+3} + x_{i+4}$ $b_i^{11} = b_i^9 + s_i^{11}$ where $s_i^{11} = x_{i-5} + x_{i-4} + x_{i-3} + x_{i-2} + x_{i-1} + x_i + x_{i+1} + x_{i+2} + x_{i+3} 30\ x_{i+4} + x_{i+5}$ Hence, the desired pyramid filter may be expressed as follows:

$B^3 = X + S_3$ where $S_3 = (s_0^3, s_1^3, s_2^3, \ldots, s_{i-1}^3, s_i^3, s_{i+1}^3, \ldots)$ $B^5 = B^3 + S_5$ where $S_3 = (s_0^5, s_1^5, s_2^5, \ldots, s_{i-1}^5, s_i^5, s_{1+1}^5, \ldots)$ $B^7 = B^5 + S_7$ where $S_7 = (s_0^7, s_1^7, s_2^7, \ldots, s_{i-1}^7, s_i^7, s_{i+1}^7, \ldots)$ $B^9 = B^7 + S_9$ where $S_9 = (s_0^9, s_1^9, s_2^9, \ldots, s_{i-1}^9, s_i^9, s_{i+1}^9, \ldots)$ $B^{11} = B^9 + S_{11}$ where $S_{11} = (s_0^{11}, s_1^{11}, s_2^{11}, \ldots, s_{i-1}^{11}, s_i^{11}, s_{i+1}^{11}, \ldots)$ A study of FIG. 2 illustrates that the computed output signal streams, $B_3$, $B_5$, $B_7$, $B_9$, $B_{11}$, etc. of the pyramid filters shown in FIG. 2 are produced by the embodiment illustrated.

The previous discussion of pyramid filters occurs in the context of one-dimensional filtering; however, due at least in part to the symmetric nature of such filters, it is possible to implement pyramid two-dimensional filtering instead of computing in a row-wise and column-wise one-dimensional fashion that employs extra computational steps. If we represent the one-dimensional k-tap pyramid filter as $$F_k = \begin{bmatrix} 1 & 2 & 3 & \cdots & \frac{k+1}{2} & \cdots & 3 & 2 & 1 \end{bmatrix},$$

the corresponding two dimensional pyramid filter $F_{k \times k}$ may be derived as shown in FIG. 6. In FIG. 7, we have shown the two-dimensional pyramid filter kernel for k=11. Assuming a two-dimensional input signal, e.g., signal samples, having the form shown in FIG. 5, FIG. 4 is a table illustrating a matrix that may result, here a two-dimensional filtered signal sample output matrix, $P^{k \times k}$, in which the two dimensional input signal sample matrix is filtered using two-dimensional pyramid filter kernel $F_{k \times k}$.

The matrix shown in FIG. 8 may result from applying a one-dimensional k-tap pyramid filter in every row of the two-dimensional input signal sample matrix and the matrix shown in FIG. 9 may result from applying a one-dimensional k-tap pyramid filter in every column of the two-dimensional input signal sample matrix. The matrix in FIG. 4 may result from applying the two-dimensional (k×k) tap filter to the two dimensional input signal sample matrix or, alternatively, it may result from applying the one-dimensional k-tap pyramid filter row-wise and then followed by column-wise. Applying this approach to generate filtered signal sample outputs $P^{1\times3}$, $P^{3\times1}$, and $P^{3\times3}$, produces the following relationships:

$$P_{i,j}^{1\times3} = s_{i,j-1} + 2s_{i,j} + s_{i,j+1}$$

$$P_{i,j}^{3\times1} = s_{i-1,j} + 2s_{i,j} + s_{i+1,j}$$

$$P_{i,j}^{3\times3} = s_{i-1,j-1} + 2s_{i-1,j} + s_{i-1,j+1} +$$
$$2s_{i,j-1} + 4s_{i,j} + 2s_{i,j-1} + s_{i+1,j-1} + 2s_{i+1,j} + s_{i+1,j+1}$$

Generating filtered signal sample outputs $P^{5\times1}$, $P^{1\times5}$, and $P^{5\times5}$, produces the following relationships:

$$P_{i,j}^{5\times1} = s_{i-2,j} + 2s_{i-1,j} + 3s_{i,j} + 2s_{i+1,j} + s_{i+2,j}$$

$$P_{i,j}^{1\times5} = s_{i,j-2} + 2s_{i,j-1} + 3s_{i,j} + 2s_{i,j+1} + s_{i,j+2}$$

$$P_{i,j}^{5\times5} = (s_{i-2,j-2} + 2s_{i-2,j-1} + 3s_{i-2,j} + 2s_{i-2,j+1} + s_{i-2,j+2}) +$$
$$(2s_{i-1,j-2} + 4s_{i-1,j-1} + 6s_{i-1,j} + 4s_{i-1,j+1} + 2s_{i-1,j+2}) +$$
$$(3s_{i,j-2} + 6s_{i,j-1} + 9s_{i,j} + 6s_{i,j+1} + 3s_{i,j+2}) +$$
$$(2s_{i+1,j-2} + 4s_{i+1,j-1} + 6s_{i+1,j} + 4s_{i+1,j+1} + 2s_{i+1,j+2}) +$$
$$(s_{i+2,j-2} + 2s_{i+2,j-1} + 3s_{i+2,j} + 2s_{i+2,j+1} + s_{i+2,j+2})$$

Likewise, generating filtered signal samples outputs $P^{7\times1}$, $P^{1\times7}$, and $P^{7\times7}$, produces the following relationships:

$$P_{i,j}^{7\times1} = s_{i-3,j} + 2s_{i-2,j} + 3s_{i-1,j} + 4s_{i,j} + 3s_{i+1,j} + 2s_{i+2,j} + s_{i+3,j}$$

$$P_{i,j}^{1\times7} = s_{i,j-3} + 2s_{i,j-2} + 3s_{i,j-1} + 4s_{i,j} + 3s_{i,j+1} + 2s_{i,j+2} + s_{i,j+3}$$

-continued $$P_{i,j}^{7\times7} = (s_{i-3,j-3} + 2s_{i-3,j-2} + 3s_{i-3,j-1} + 4s_{i-3,j} + 3s_{i-3,j+1} +$$
$$2s_{i-3,j+2} + s_{i-3,j+3}) + (2s_{i-2,j-3} + 4s_{i-2,j-2} + 6s_{i-2,j-1} +$$
$$8s_{i-2,j} + 6s_{i-2,j+1} + 4s_{i-2,j+2} + 2s_{i-2,j+3}) + (3s_{i-1,j-3} +$$
$$6s_{i-1,j-2} + 9s_{i-1,j-1} + 12s_{i-1,j} + 9s_{i-1,j+1} + 6s_{i-1,j+2} +$$
$$3s_{i-1,j+3}) + (4s_{i,j-3} + 8s_{i,j-2} + 12s_{i,j-1} + 16s_{i,j} + 12s_{i,j+1} +$$
$$8s_{i,j+2} + 4s_{i,j+3}) + (3s_{i+1,j-3} + 6s_{i+1,j-2} + 9s_{i+1,j-1} + 12s_{i+1,j} +$$
$$9s_{i+1,j+1} + 6s_{i+1,j+2} + 3s_{i+1,j+3}) + (2s_{i+2,j-3} + 4s_{i+2,j-2} +$$
$$6s_{i+2,j-1} + 8s_{i+2,j} + 6s_{i+2,j+1} + 4s_{i+2,j+2} + 2s_{i+2,j+3}) +$$
$$(s_{i+3,j-3} + 2s_{i+3,j-2} + 3s_{i+3,j-1} + 4s_{i+3,j} + 3s_{i+3,j+1} +$$
$$2s_{i+3,j+2} + s_{i+3,j+3})$$

Likewise, generating filtered signal samples outputs $P^{9\times1}$, $P^{1\times9}$, and $P^{9\times9}$, produces the following relationships:

$$P_{i,j}^{9\times1} = s_{i-4,j} + 2s_{i-3,j} + 3s_{i-2,j} + 4s_{i-1,j} + 5s_{i,j} + 4s_{i+1,j} + 3s_{i+2,j} +$$
$$2s_{i+3,j} + s_{i+4,j}$$

$$P_{i,j}^{1\times9} = s_{i,j-4} + 2s_{i,j-3} + 3s_{i,j-2} + 4s_{i,j-1} + 5s_{i,j} + 4s_{i,j+1} + 3s_{i,j+2} +$$
$$2s_{i,j+3} + s_{i,j+4}$$

$$P_{i,j}^{9\times9} = (s_{i-4,j-4} + 2s_{i-4,j-3} + 3s_{i-4,j-2} + 4s_{i-4,j-1} + 5s_{i-4,j} +$$
$$4s_{i-4,j+1} + 3s_{i-4,j+2} + 2s_{i-4,j+3} + s_{i-4,j+4}) + (2s_{i-3,j-4} +$$
$$4s_{i-3,j-3} + 6s_{i-3,j-2} + 8s_{i-3,j-1} + 10s_{i-3,j} + 8s_{i-3,j+1} +$$
$$6s_{i-3,j+2} + 4s_{i-3,j+3} + 2s_{i-3,j+4}) + (3s_{i-2,j-4} + 6s_{i-2,j-3} +$$
$$9s_{i-2,j-2} + 12s_{i-2,j-1} + 15s_{i-2,j} + 12s_{i-2,j+1} + 9s_{i-2,j+2} +$$
$$6s_{i-2,j+3} + 3s_{i-2,j+4}) + (4s_{i-1,j-4} + 8s_{i-1,j-3} + 12s_{i-1,j-2} +$$
$$16s_{i-1,j-1} + 20s_{i-1,j} + 16s_{i-1,j+1} + 12s_{i-1,j+2} + 8s_{i-1,j+3} +$$
$$4s_{i-1,j+4}) + (5s_{i,j-4} + 10s_{i,j-3} + 15s_{i,j-2} + 20s_{i,j-1} + 25s_{i,j} +$$
$$20s_{i,j+1} + 15s_{i,j+2} + 10s_{i,j+3} + 5s_{i,j+4}) + (4s_{i+1,j-4} +$$
$$8s_{i+1,j-3} + 12s_{i+1,j-2} + 16s_{i+1,j-1} + 20s_{i+1,j} + 16s_{i+1,j+1} +$$
$$12s_{i+1,j+2} + 8s_{i+1,j+3} + 4s_{i+1,j+4}) + (3s_{i+2,j-4} + 6s_{i+2,j-3} +$$
$$9s_{i+2,j-2} + 12s_{i+2,j-1} + 15s_{i+2,j} + 12s_{i+2,j+1} + 9s_{i+2,j+2} +$$
$$6s_{i+2,j+3} + 3s_{i+2,j+4}) + (2s_{i+3,j-4} + 4s_{i+3,j-3} + 6s_{i+3,j-2} +$$
$$8s_{i+3,j-1} + 10s_{i+3,j} + 8s_{i+3,j+1} + 6s_{i+3,j+2} + 4s_{i+3,j+3} +$$
$$2s_{i+3,j+4}) + (s_{i+4,j-4} + 2s_{i+4,j-3} + 3s_{i+4,j-2} + 4s_{i+4,j-1} +$$
$$5s_{i+4,j} + 4s_{i+4,j+1} + 3s_{i+4,j+2} + 2s_{i+4,j+3} + s_{i+4,j+4})$$

Furthermore, generating filtered signal samples outputs $P^{11\times1}$, $P^{1\times11}$, and $P^{11\times11}$, produces the following relationships:

$$P_{i,j}^{11\times1} = s_{i-5,j} + 2s_{i-4,j} + 3s_{i-3,j} + 4s_{i-2,j} + 5s_{i-1,j} + 6s_{i,j} + 5s_{i+1,j} +$$
$$4s_{i+2,j} + 3s_{i+3,j} + 2s_{i+4,j} + s_{i+5,j}$$

$$P_{i,j}^{1\times11} = s_{i,j-5} + 2s_{i,j-4} + 3s_{i,j-3} + 4s_{i,j-2} + 5s_{i,j-1} + 6s_{i,j} + 5s_{i,j+1} +$$
$$4s_{i,j+2} + 3s_{i,j+3} + 2s_{i,j+4} + s_{i,j+5}$$

$$P_{i,j}^{11\times11} = (s_{i-5,j-5} + 2s_{i-5,j-4} + 3s_{i-5,j-3} + 4s_{i-5,j-2} + 5s_{i-5,j-1} +$$
$$6s_{i-5,j} + 5s_{i-5,j+1} + 4s_{i-5,j+2} + 3s_{i-5,j+3} + 2s_{i-5,j+4} +$$
$$s_{i-5,j+5}) + (2s_{i-4,j-5} + 4s_{i-4,j-4} + 6s_{i-4,j-3} + 8s_{i-4,j-2} +$$

-continued $10s_{i-4,j-1} + 12s_{i-4,j} + 10s_{i-4,j+1} + 8s_{i-4,j+2} +$ $6s_{i-4,j+3} + 4s_{i-4,j+4} + 2s_{i-4,j+5}) + (3s_{i-3,j-5} + 6s_{i-3,j-4} +$ $9s_{i-3,j-3} + 12s_{i-3,j-2} + 15s_{i-3,j-1} + 18s_{i-3,j} + 15s_{i-3,j+1} +$ $12s_{i-3,j+2} + 9s_{i-3,j+3} + 6s_{i-3,j+4} + s_{i-3,j+5}) + (4s_{i-2,j-5} +$ $8s_{i-2,j-4} + 12s_{i-2,j-3} + 16s_{i-2,j-2} + 20s_{i-2,j-1} + 24s_{i-2,j} +$ $20s_{i-2,j+1} + 16s_{i-2,j+2} + 12s_{i-2,j+3} + 8s_{i-2,j+4} + 4s_{i-2,j+5}) +$ $(5s_{i-1,j-5} + 10s_{i-1,j-4} + 15s_{i-1,j-3} + 20s_{i-1,j-2} + 25s_{i-1,j-1} +$ $30s_{i-1,j} + 25s_{i-1,j+1} + 20s_{i-1,j+2} + 15s_{i-1,j+3} + 10s_{i-1,j+4} +$ $5s_{i-1,j+5}) + (6s_{i,j-5} + 12s_{i,j-4} + 18s_{i,j-3} + 24s_{i,j-2} +$ $30s_{i,j-1} + 36s_{i,j} + 30s_{i,j+1} + 24s_{i,j+2} + 18s_{i,j+3} + 12s_{i,j+4} +$ $6s_{i,j+5}) + (5s_{i+1,j-5} + 10s_{i+1,j-4} + 15s_{i+1,j-3} + 20s_{i+1,j-2} +$ $25s_{i+1,j-1} + 30s_{i+1,j} + 25s_{i+1,j+1} + 20s_{i+1,j+2} + 15s_{i+1,j+3} +$ $10s_{i+1,j+4} + 5s_{i+1,j+5}) + (4s_{i+2,j-5} + 8s_{i+2,j-4} + 12s_{i+2,j-3} +$ $16s_{i+2,j-2} + 20s_{i+2,j-1} + 24s_{i+2,j} + 20s_{i+2,j+1} + 16s_{i+2,j+2} +$ $12s_{i+2,j+3} + 8s_{i+2,j+4} + 4s_{i+2,j+5}) + (3s_{i+3,j-5} + 6s_{i+3,j-4} +$ $9s_{i+3,j-3} + 12s_{i+3,j-2} + 15s_{i+3,j-1} + 18s_{i+3,j} + 15s_{i+3,j+1} +$ $12s_{i+3,j+2} + 9s_{i+3,j+3} + 6s_{i+3,j+4} + 3s_{i+3,j+5}) + (2s_{i+4,j-5} +$ $4s_{i+4,j-4} + 6s_{i+4,j-3} + 8s_{i+4,j-2} + 10s_{i+4,j-1} + 12s_{i+4,j} +$ $10s_{i+4,j+1} + 8s_{i+4,j+2} + 6s_{i+4,j+3} + 4s_{i+4,j+4} + 2s_{i+4,j+5}) +$ $(s_{i+5,j-5} + 2s_{i+5,j-4} + 3s_{i+5,j-3} + 4s_{i+5,j-2} + 5s_{i+5,j-1} +$ $6s_{i+5,j} + 5s_{i+5,j+1} + 4s_{i+5,j+2} + 3s_{i+5,j+3} + 2s_{i+5,j+4} +$ $s_{i+5,j+5})$ Mathematical manipulation may be employed to produce the following:

$$P_{i,j}^{11\times11} = (P_{i-1,j-1}^{9\times9} + P_{i-1,j+1}^{9\times9} + P_{i+1,j-1}^{9\times9} + P_{i+1,j+1}^{9\times9}) - \quad [1]$$

$$(P_{i,j-3}^{11\times1} + 2P_{i,j-2}^{11\times1} + 3P_{i,j-1}^{11\times1} + 2P_{i,j}^{11\times1} + 3P_{i,j+1}^{11\times1} + 2P_{i,j+2}^{11\times1} + P_{i,j+3}^{11\times1}) -$$

$$(P_{i-3,j}^{1\times11} + 2P_{i-2,j}^{1\times11} + 3P_{i-1,j}^{1\times11} + 2P_{i,j}^{1\times11} + 3P_{i+1,j}^{1\times11} + 2P_{i+2,j}^{1\times11} + P_{i+3,j}^{1\times11}) -$$

$$P_{i,j}^{7\times7} + 2(P_{i,j}^{7\times1} + P_{i,j}^{1\times7}) - 4s_{i,j}$$

Figure 3:
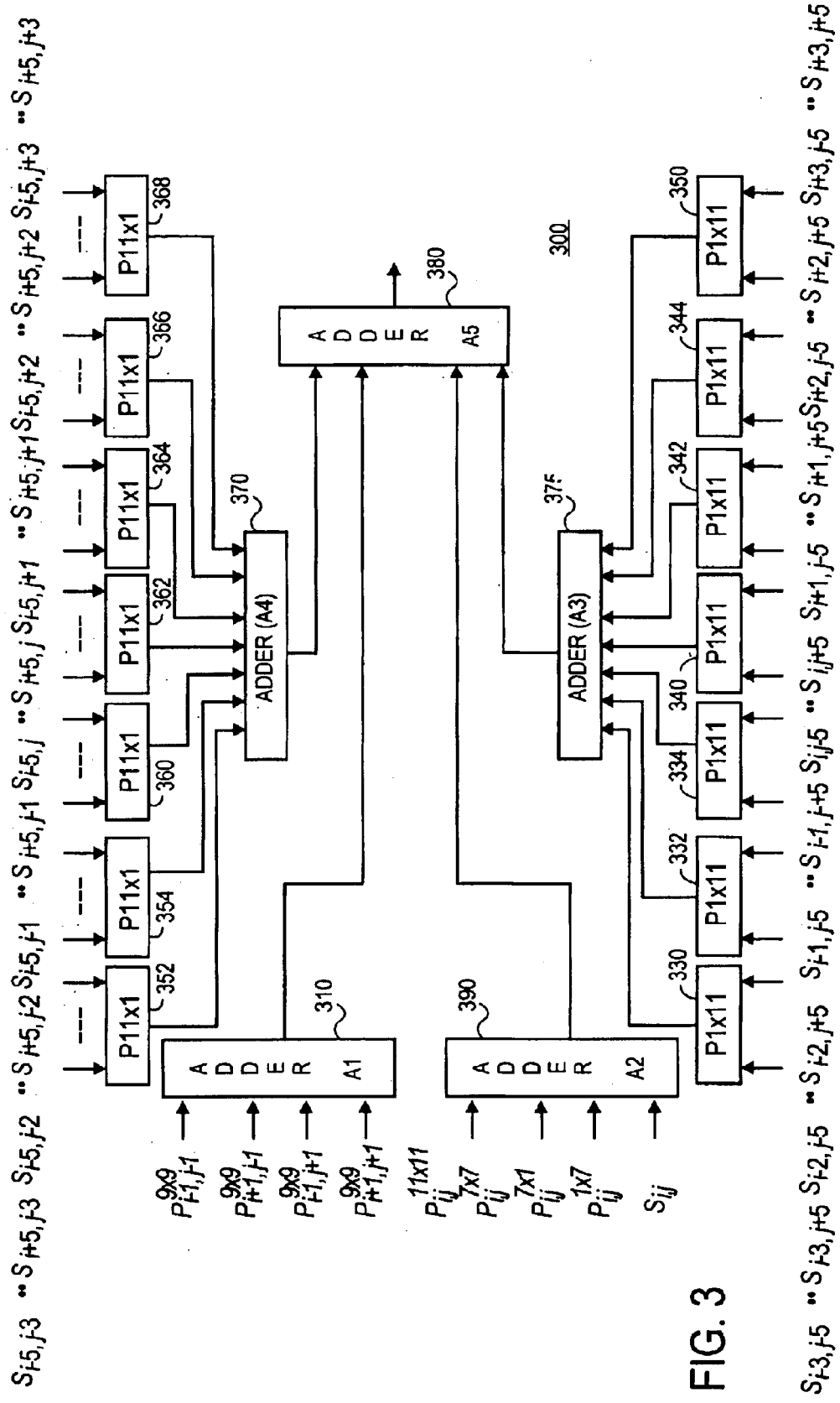
FIG. 3 is one embodiment of a two-dimensional pyramid filter architecture.

Equation [1] above illustrates that a direct two-dimensional pyramid filter architecture of order 2N−1, in this case where N is six, may potentially be implemented using either four two-dimensional pyramid filters of order [2(n−1)−1], that is nine or one two-dimensional pyramid filter of order [2(N−1)−1] using four signal sample matrices $P_{i-1,j-1}^{9\times9}$, $P_{i-1,j+1}^{9\times9}$, $P_{i+1,j-1}^{9\times9}$, $P_{i+1,j+1}^{9\times9}$ and fourteen one-dimensional pyramid filters of order 2N−1, here eleven, the filters being row-wise and column-wise, in this example. It also employs one two-dimensional pyramid filter of order [2(N−2)−1], that is seven here, to produce $P_{i,j}^{7\times7}$ and two one-dimensional pyramid filters of order [2(N−2)−1], that is seven here, to produce two signal sample matrices $P_{i,j}^{7\times1}$, $P_{i,j}^{1\times7}$, in this example. FIG. 3 is a schematic diagram illustrating such an embodiment, although, of course, the claimed subject matter is not limited in scope to this particular implementation or embodiment. For example, the output signal samples corresponding to those produced by four two-dimensional pyramid filters of order 2(N−1)−1, here order nine where N is six, and also the output signal samples produced by two-dimensional pyramid filter of order 2(N−2)−1, here order seven, may not necessarily be produced by two-dimensional pyramid filters. As just one example, these output signals may be produced using one-dimensional pyramid filters. One such filter is shown in FIG. 2, although, again, additional approaches to producing the output signals for the architecture shown in FIG. 3 may also be employed.

FIG. 3 illustrates an integrated circuit (IC), 300, although, of course, alternative embodiments may not necessarily be implemented on a single integrated circuit chip. IC 300 includes a two-dimensional pyramid filter architecture of an order 2N−1, where N is a positive integer greater than five, here six, in operation, capable of producing, on respective clock cycles, at least the following. Pyramid filtered output signals are produced corresponding to output signals produced by fourteen one-dimensional pyramid filters of order 2N−1, again, eleven in this example where N is six, 330, 332, 334, 340, 342, 344, 350, 352, 354, 360, 362, 364, 366, and 368 in FIG. 3. Pyramid filtered output signals are also produced corresponding to output signals produced either by four two-dimensional pyramid filters or one two-dimensional pyramid of order [2(N−1)−1] or nine here, where N is six, using signal sample matrices $P_{i-1,j-1}^{9\times9}$, $P_{i-1,j+1}^{9\times9}$, $P_{+1,j-1}^{9\times9}$, $P_{i+1,j+1}^{9\times9}$. These output signals are summed by adder 310 FIG. 3. Pyramid filtered output signals are also produced corresponding to output signals produced by one two-dimensional pyramid filter of order [2(N−2)−1] or seven here, where N is six, using signal sample matrix $P_{i,j}^{7\times7}$ and two one-dimensional pyramid filter of order 2(N−2)−1 using signal sample matrices $P_{i,j}^{7\times1}$, $P_{i,j}^{1\times7}$. These three output signals $P_{i,j}^{7\times7}$, $P_{i,j}^{7\times7}$, $P_{i,j}^{1\times7}$ and the input signal $s_{i,j}$ are summed by adder 390 in FIG. 3. Likewise, the respective output signals in this two dimensional pyramid filter architecture implementation, in the implementation in FIG. 3, for example, the output signals of 330, 332, 334, 340, 342, 344, 350, 352, 354, 360, 362, 364, 366, and 368 are summed on respective clock cycles of the two dimensional pyramid filter architecture, by adders 370 and 375 in FIG. 3. Adder 380 sums the output signals of 310, 370, 375 and 390. Of course, FIG. 3 is just one possible example of an implementation and the claimed subject matter is not limited in scope to this or to another particular implementation.

For example, N is not limited to six. Likewise, the pyramid filtered output signals that correspond to output signals produced by a two-dimensional pyramid filter are not limited to being implemented by one-dimensional pyramid filters or to two-dimensional pyramid filters. Likewise, as previously indicated, if one-dimensional filters are employed, then the filters are not limited to the implementation approach described in aforementioned U.S. patent application Ser. No. 09/754,684, titled "Multiplierless Pyramid Filter," filed Jan. 3, 2001, by Tinku Acharya, or in aforementioned U.S. patent application Ser. No. 07/820,108, titled "Pyramid Filter," (attorney docket 042390.P11211), filed on Mar. 28, 2001, by Tinku Acharya. For example, one-dimensional pyramid filters other than multiplierless pyramid filters may be employed. Likewise, depending on the implementation, different numbers of such pyramid filters and different orders of such pyramid filters may be employed. For example, the output signals may be combined or processed in a way to produce pyramid filtered output signals corresponding to pyramid filters of a different number, dimension, or order.

It will, of course, be understood that, although particular embodiments have just been described, the claimed subject matter is not limited in scope to a particular embodiment or implementation. For example, one embodiment may be in hardware, whereas another embodiment may be in software. Likewise, an embodiment may be in firmware, or any combination of hardware, software, or firmware, for example. Likewise, although the claimed subject matter is not limited in scope in this respect, one embodiment may comprise an article, such as a storage medium. Such a storage medium, such as, for example, a CD-ROM, or a disk, may have stored thereon instructions, which when executed by a system, such as a computer system or platform, or an imaging system, for example, may result in an embodiment of a method in accordance with the claimed subject matter being executed, such as an embodiment of a method of filtering or processing an image or video, for example, as previously described. For example, an image processing platform or an imaging processing system may include an image processing unit, a video or image input/output device and/or memory.

While certain features of the claimed subject matter have been illustrated and described herein, many modifications, substitutions, changes and equivalents will now occur to those skilled in the art. It is, therefore, to be understood that the appended claims are intended to cover all such modifications and changes as fall within the true spirit of the claimed subject matter.

What is claimed is:

1. An integrated circuit comprising:
    a two-dimensional pyramid filter architecture of an order $2N-1$, where N is a positive integer greater than five;
    said two dimensional pyramid filter architecture of order $2N-1$, in operation, capable of producing, on respective clock cycles, at least the following:
        pyramid filtered output signals corresponding to output signals produced by fourteen one-dimensional pyramid filters of order $2N-1$; and
        pyramid filtered output signals corresponding to output signals produced either by four two-dimensional pyramid filters or one two-dimensional pyramid filter of order $[2(N-1)-1]$ using signal sample matrices of order $[2(N-1)-1]$;
    wherein the respective output signals in said two dimensional pyramid filter architecture are summed on respective clock cycles of said two dimensional pyramid filter architecture.

2. The integrated circuit of claim 1, wherein N is six; and wherein said two dimensional pyramid filter architecture of order eleven, in operation, capable of producing, on respective clock cycles, the pyramid filtered output signals corresponding to output signals produced either by four two-dimensional pyramid filters or one two-dimensional pyramid of order nine using four signal sample matrices $P_{i-1,j-1}^{9\times9}$, $P_{i-1,j+1}^{9\times9}$, $P_{i+1,j-1}^{9\times9}$, $P_{i+1,j+1}^{9\times9}$, the pyramid filtered output signals being produced by a plurality of one-dimensional pyramid filters.

3. The integrated circuit of claim 2, wherein said one-dimensional pyramid filters comprise a sequence of scalable cascaded multiplerless operational units, each of said operational units capable of producing a different order pyramid filtered output signal sample stream.

4. The integrated circuit of claim 2, wherein said one-dimensional pyramid filters comprise other than one-dimensional multiplierless pyramid filters.

5. The integrated circuit of claim 2, wherein said two dimensional pyramid filter architecture of order eleven, in operation, capable of producing, on respective clock cycles, the pyramid filtered output signals corresponding to output signals produced either by four two-dimensional pyramid filters or one two-dimensional pyramid of order seven using four signal sample matrices $P_{i-1,j-1}^{9\times9}$, $P_{i-1,j+1}^{9\times9}$, $P_{i+1,j-1}^{9\times9}$, $P_{i+1,j+1}^{9\times9}$, the pyramid filtered output signals produced by a plurality of one-dimensional pyramid filters being produced by eight one-dimensional pyramid filters of order nine.

6. The integrated circuit of claim 5, wherein, of the eight one-dimensional pyramid filters of order nine, four are applied row-wise and four are applied column-wise.

7. The integrated circuit of claim 5, wherein said two dimensional pyramid filter architecture of order eleven, in operation, capable of producing, on respective clock cycles, the pyramid filtered output signals corresponding to output signals produced by four two-dimensional pyramid filters of order nine, the pyramid filtered output signals produced by a plurality of one-dimensional pyramid filters being produced by eight one-dimensional multiplierless pyramid filters of order nine.

8. The integrated circuit of claim 7, wherein, of the eight one-dimensional pyramid filters of order nine, four are applied row-wise and four are applied column-wise.

9. The integrated circuit of claim 2, wherein said two dimensional pyramid filter architecture of order eleven, in operation, capable of producing, on respective clock cycles, the pyramid filtered output signals corresponding to output signals produced by four two-dimensional pyramid filters of order nine, the pyramid filtered output signals produced by a plurality of one-dimensional pyramid filters being produced by other than one-dimensional multiplierless pyramid filters.

10. The integrated circuit of claim 1, wherein N is six;
    said two dimensional pyramid filter architecture of order eleven, in operation, being capable of producing, on respective clock cycles, at least the following:
        output signals produced by four two-dimensional pyramid filters of order nine.

11. The integrated circuit of claim 1, wherein said two dimensional pyramid filter architecture of order eleven, in operation, capable of producing, on respective clock cycles, the pyramid filtered output signals corresponding to output signals produced by four two-dimensional pyramid filters of order nine, the pyramid filtered output signals being produced by one or more two-dimensional pyramid filters other than four two-dimensional pyramid filters.

12. A method of filtering an image using a two-dimensional pyramid filter architecture of order $2N-1$, where N is a positive integer greater than five, said method comprising:
    summing, on respective clock cycles of said two dimensional pyramid filter architecture, the following:
        pyramid filtered output signals corresponding to output signals produced by fourteen one-dimensional pyramid filters of order $2N-1$; and
        pyramid filtered output signals corresponding to output signals produced either by four two-dimensional pyramid filters or one two-dimensional pyramid filter of order $[2(N-1)-1]$ using signal sample matrices of order $[2(N-1)-1]$.

13. The method of claim 12, wherein N is six;
    pyramid filtered output signals corresponding to output signals produced either by four two-dimensional pyramid filters or one two-dimensional pyramid filter of order $[2(N-1)-1]$ using signal sample matrices of order $[2(N-1)-1]$ comprising output signals produced by four two-dimensional pyramid filters of order nine.

14. The method of claim 12, wherein N is six; and wherein the pyramid filtered output signals corresponding to output signals produced either by four two-dimensional pyramid filters or one two-dimensional pyramid filter of order nine using four signal sample matrices $P_{i-1,j-1}^{9\times9}$, $P_{i-1,j+1}^{9\times9}$, $P_{i+1,j-1}^{9\times9}$, $P_{i+1,j+1}^{9\times9}$ comprise pyramid filtered output signals produced by a plurality of one-dimensional pyramid filters.

15. The method of claim 14, wherein said one-dimensional pyramid filters comprise a sequence of scalable cascaded multiplerless operational units, each of said operational units capable of producing a different order pyramid filtered output signal sample stream.

16. An article comprising: a storage medium, said storage medium having stored thereon instructions, that, when executed result in filtering an image using a two-dimensional pyramid filter architecture of order 2N−1, where N is a positive integer greater than five, by:
   summing, on respective clock cycles of said two dimensional pyramid filter architecture, the following:
      pyramid filtered output signals corresponding to output signals produced by fourteen one-dimensional pyramid filters of order 2N−1; and
      pyramid filtered output signals corresponding to output signals produced either by four two-dimensional pyramid filters or one two-dimensional pyramid filter of order [2(N−1)−1] using signal sample matrices of order [2(N−1)−1].

17. The article of claim 16, wherein N is six;
pyramid filtered output signals corresponding to output signals produced either by four two-dimensional pyramid filters or one two-dimensional pyramid filter of order [2(N−1)−1] using signal sample matrices of order [2(N−1)−1] comprising output signals produced by four two-dimensional pyramid filters of order nine.

18. The article of claim 16, wherein N is six; and
wherein the pyramid filtered output signals corresponding to output signals produced either by four two-dimensional pyramid filters or one two-dimensional pyramid of order nine using four signal sample matrices $P_{i-1,j-1}^{9\times9}$, $P_{i-1,j+1}^{9\times9}$, $P_{i+1,j-1}^{9\times9}$, $P_{i+1,j+1}^{9\times9}$, comprise pyramid filtered output signals produced by a plurality of one-dimensional pyramid filters.

19. The article of claim 18, wherein said one-dimensional pyramid filters comprise a sequence of scalable cascaded multiplierless operational units, each of said operational units capable of producing a different order pyramid filtered output signal sample stream.

20. An image processing system comprising:
an image processing unit to filter scanned color images;
said image processing unit including at least one two-dimensional pyramid filter architecture;
said at least one two-dimensional pyramid filter architecture comprising:
   a two-dimensional pyramid filter architecture of an order 2N−1, where N is a positive integer greater than five;
   said two dimensional pyramid filter architecture of order 2N−1, in operation, capable of producing, on respective clock cycles, at least the following:
      pyramid filtered output signals corresponding to output signals produced by fourteen one-dimensional pyramid filters of order 2N−1; and
      pyramid filtered output signals corresponding to output signals produced either by four two-dimensional pyramid filters or one two-dimensional pyramid filter of order [2(N−1)−1] using signal sample matrices of order [2(N−1)−1];
   wherein the respective output signals in said two dimensional pyramid filter architecture are summed on respective clock cycles of said two dimensional pyramid filter architecture.

21. The system of claim 20, wherein N is six;
pyramid filtered output signals corresponding to output signals produced either by four two-dimensional pyramid filters or one two-dimensional pyramid filter of order [2(N−1)−1] using signal sample matrices of order [2(N−1)−1] comprising output signals produced by four two-dimensional pyramid filters of order nine.

22. The system of claim 20, wherein N is six; and
wherein the pyramid filtered output signals corresponding to output signals produced either by four two-dimensional pyramid filters or one two-dimensional pyramid of order seven using four signal sample matrices $P_{i-1,j-1}^{9\times9}$, $P_{i-1,j+1}^{9\times9}$, $P_{i+1,j-1}^{9\times9}$, $P_{i+1,j+1}^{9\times9}$, comprise pyramid filtered output signals produced by a plurality of one-dimensional pyramid filters.

23. The system of claim 22, wherein said one-dimensional pyramid filters comprise a sequence of scalable cascaded multiplerless operational units, each of said operational units capable of producing a different order pyramid filtered output signal sample stream.

* * * * *

UNITED STATES PATENT AND TRADEMARK OFFICE
CERTIFICATE OF CORRECTION

PATENT NO. : 6,725,247 B2
DATED : April 20, 2004
INVENTOR(S) : Acharya

It is certified that error appears in the above-identified patent and that said Letters Patent is hereby corrected as shown below:

Column 3,
Lines 32, 51, 53, 55, 57, 59 and 64, delete "$\hat{X}$" and insert --$\otimes$--.

Column 7,
Line 52, delete "$P_{i-1,j-1}^{9x9}$" and insert --$P_{i-1,j+1}^{9x9}$--.

Column 8,
Line 23, delete "$P_{+1,j-1}^{9x9}$" and insert --$P_{i+1,j-1}^{9x9}$--.

Line 30, delete "$P_{i,j}^{7x7}$" and insert --$P_{i,j}^{7x1}$--.

Signed and Sealed this

Thirteenth Day of July, 2004

JON W. DUDAS
*Acting Director of the United States Patent and Trademark Office*